United States Patent [19]
VanDerStuyf et al.

[11] Patent Number: 5,530,625
[45] Date of Patent: Jun. 25, 1996

[54] ELECTRICAL INTERFACE BOARD INCLUDING FLAT RIBBON CONDUCTORS POSITIONED ON EDGE

[75] Inventors: Allen VanDerStuyf, Novi; Dewey Mobley, Lake Orion; James P. Burgess, Troy, all of Mich.

[73] Assignee: Electro-Wire Products, Inc., Troy, Mich.

[21] Appl. No.: 301,794

[22] Filed: Sep. 7, 1994

[51] Int. Cl.⁶ .............................. H05K 1/11; H01B 1/14; H01R 23/68; H01R 23/70

[52] U.S. Cl. .......................... 361/794; 174/255; 361/790; 361/736; 361/822; 361/826; 439/44; 439/47; 439/74

[58] Field of Search .................................... 174/50, 50.52, 174/52.1, 72 B, 70 B, 71 B, 255, 72 A; 361/728, 736, 744, 792–795, 803, 822, 823, 826, 828, 807, 809, 733, 772, 774, 775, 777, 778, 779, 780, 784, 790, 791, 789; 439/65, 74, 76, 535, 403, 402, 404, 405, 49, 189, 34, 43

[56] References Cited

U.S. PATENT DOCUMENTS

| | | | |
|---|---|---|---|
| 3,469,018 | 9/1965 | Arny | 361/809 |
| 5,040,097 | 8/1991 | Stribel | 361/736 |
| 5,207,587 | 5/1993 | Hamill et al. | 361/826 |
| 5,229,922 | 7/1993 | Muramatsu et al. | 361/736 |

*Primary Examiner*—Donald A. Sparks
*Attorney, Agent, or Firm*—Gifford, Krass, Groh, Sprinkle, Patmore, Anderson & Citkowski

[57] ABSTRACT

An interface board for use, for example, in a motor vehicle to provide electrical interconnection between a plurality of electrical circuit control elements and a wiring harness. The board comprises a box structure including a plurality of circuit outlets on the upper face of the structure for plug in receipt of the electrical circuit control elements, a plurality of power outlets on a lower face of the structure for plug in receipt of electrical power input and output elements, and a series of electrical paths extending between the power outlets and a circuit control outlets. Each electrical path includes a first conductor extending generally parallel to the first and second faces and second conductors extending generally perpendicular to the first and second faces. The first conductors comprise flat ribbon elements and the second conductors comprise flat ribbon elements connected to the flat sides of the first conductors utilizing clinch joints.

8 Claims, 5 Drawing Sheets

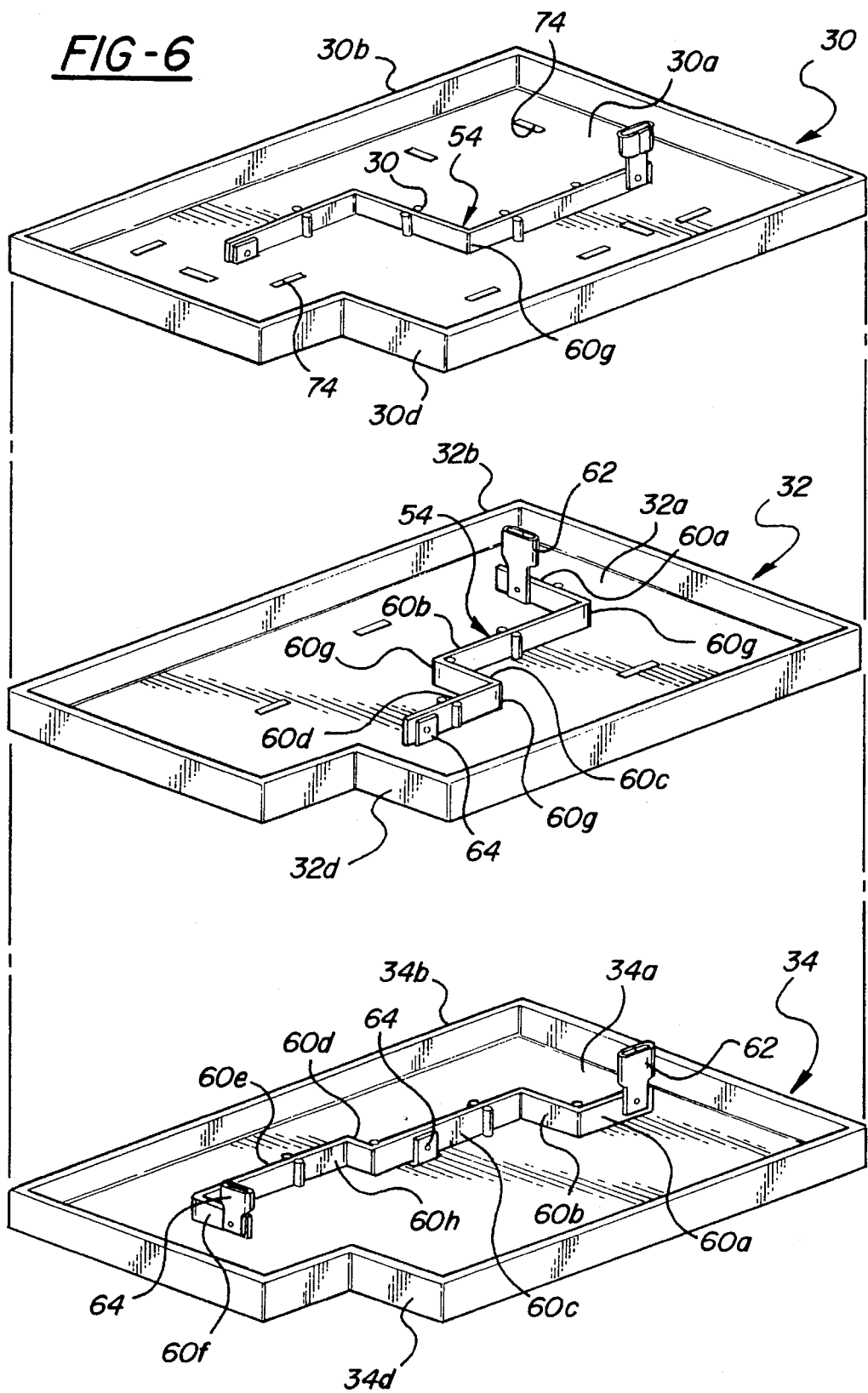

ELECTRICAL INTERFACE BOARD INCLUDING FLAT RIBBON CONDUCTORS POSITIONED ON EDGE

BACKGROUND OF THE INVENTION

This invention relates to an electrical interface board for use in facilitating interconnection between electrical elements and circuits.

Electrical interface boards are in wide use as, for example, to facilitate the control of the multiplicity of individual electrical circuits found in the typical modern day motor vehicle. The electrical interface board in a motor vehicle may, for example, be mounted under the hood of the vehicle and may comprise a box structure including a plurality of circuit outlets on a first face of the structure for plug in receipt of electrical control elements such as fuses and relays, a plurality of power outlets on a second opposite face of the box structure for plug in receipt of electrical power input and output elements in the form, for example, of wiring harnesses, and a series of electrical paths extending between the power outlets and the circuit control outlets and each including first conductors extending generally parallel to the first and second faces of the box structure and second conductors extending generally perpendicular to the first and second faces for connection at their respective upper and lower ends with electrical control elements and the wiring harness.

While this arrangement provides an efficient means of distributing power within the box structure and selectively interconnecting the electrical circuit control elements with the wiring harness, this particular form of interface board is expensive to produce since each of the electrical paths extending between the power outlets and the circuit control outlets, and in particular the horizontal conductors of the circuit paths, are dedicated to a particular circuit path and a particular interface board and must be modified to accommodate different interface boards in different vehicles or to accommodate variations in the interface board in a given vehicle resulting from variations in the optional equipment on the vehicle. Since these horizontal conductors are typically formed utilizing hard tooling, and since this hard tooling is relatively expensive, each change or modification to the interface board to accommodate a different electrical path, as required by different vehicles or different optional equipment on the same vehicle, is very costly with the result that the overall cost of the interface board is relatively high. Further, the horizontal conductor elements and the vertical conductor elements of a given circuit path are typically joined together utilizing separable male/female interface connection which are costly to produce and which tend to provide a relatively high resistance to current flow in derogation of the overall electrical efficiency of the interface board.

SUMMARY OF THE INVENTION

This invention is directed to the provision of an improved interface board.

This invention is further directed to the provision of an interface board that is inexpensive to produce.

This invention is still further directed to the provision of an interface board that provides secure, positive, low resistance interconnections between the conductor elements comprising the interface board.

The invention interface board is of the type comprising a box structure including a plurality of circuit outlets on a first face of the structure for plug in receipt of electrical circuit control elements; a plurality of power outlets on a second, opposite face of the structure for plug in receipt of electrical power input and output elements; and a series of electrical paths extending between the power outlets and the circuit control outlets and each including first conductors extending generally parallel to the first and second faces of the box structure and second conductors extending generally perpendicular to the first and second faces.

According to an important feature of the invention, the first conductors comprise flat ribbon elements extending generally parallel to the first and second faces, and the second conductors are secured to the flat sides of the first conductors. This arrangement allows the first conductors to be formed in a simple bending operation from flat ribbon stock so as to eliminate the need to provide new permanent tooling for each change of configuration for the second conductors as dictated by different vehicle requirements or different equipment requirements on the same vehicle.

According to a further feature of the invention the flat ribbon elements are positioned on edge within the box structure with their flat sides generally perpendicular to the first and second faces. This arrangement simplifies the construction of the conductor assembly and simplifies the positioning of the conductor assembly within the box structure.

According to a further feature of the invention, the second conductors are secured to the flat sides of the first conductors by clinch joints. This arrangement allows the first and second conductors to be readily joined and provides a secure, positive, low resistance connection between the first and second conductors so as to optimize the electrical efficiency of the interface board.

According to a further feature of the invention, the electrical circuit control elements comprise a variety of different electrical circuit control elements with each element having a unique male element terminal pattern, and the interface board further includes a plurality of block modules positioned at the first face of the box structure and each having sockets arranged in a pattern to accommodate the male element terminal pattern of a particular electrical circuit control element. This modular construction at the interface between the electrical circuit paths and the electrical circuit control elements allows the interface board to be readily and quickly modified to suit different vehicle requirements and different optional equipment requirements necessitating variations in the electrical circuit control elements utilized in a given vehicle.

The invention further provides a unique methodology for fabricating an electrical interface board of the type comprising a box structure including a plurality of control outlets on a first face of the structure for plug in receipt of electrical circuit control elements, a plurality of power outlets on a second, opposite face of the structure for plug in receipt of electrical power input and output elements, and a series of electrical paths extending between the power outlets and the circuit control outlets and each including first conductors extending generally parallel to first and second faces and second conductors extending generally perpendicular to the first and second faces.

According to the invention methodology, the first conductors are formed by providing a flat elongated ribbon of conductive material, the second conductors are secured to the flat sides of the ribbon at longitudinally spaced locations along the ribbon, the ribbon is selectively severed to provide a plurality of conductor assemblies, each including a first conductor and at least two second conductors secured thereto, and the conductor assemblies are positioned within the box structure with the first conductor of each assembly positioned parallel to the first and second faces and the second conductors of each assembly extending generally perpendicular to the first and second faces. This methodology allows the configuration of the first conductors to be readily and inexpensively modified to accommodate different vehicle requirements or different optional equipment requirements on a given vehicle.

According to a further feature of the invention methodology, the elongated ribbon is folded at longitudinally spaced locations along the ribbon about transverse crease lines that are parallel to the flat sides of the ribbon. This methodology further facilitates the ready modification of the first conductors to accommodate varying vehicular electrical needs.

BRIEF DESCRIPTION OF THE DRAWINGS

FIG. 6 is an exploded view of modular layers employed in the invention interface board;

DETAILED DESCRIPTION OF THE PREFERRED EMBODIMENT

Figure 1:
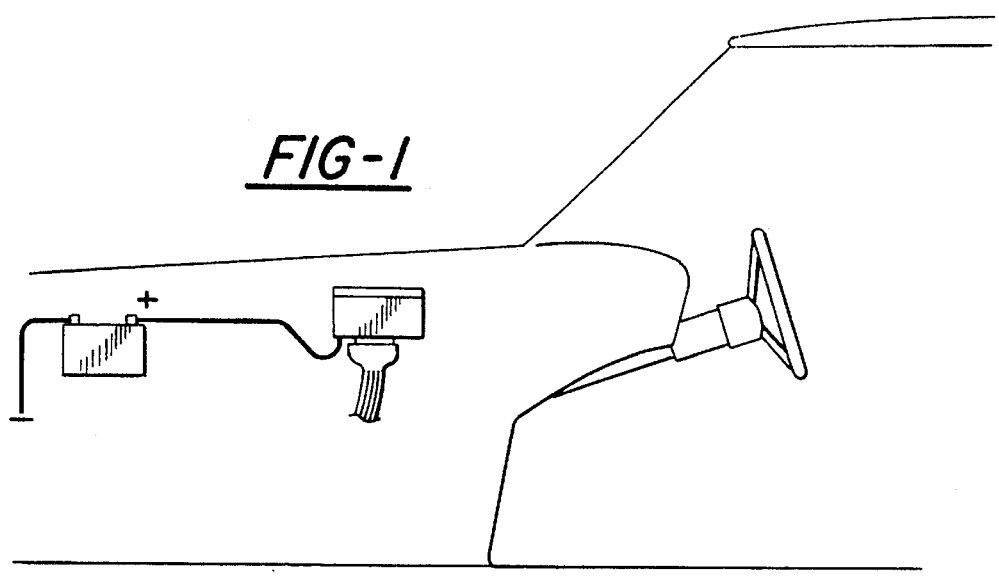
FIG. 1 is a schematic fragmentary view of a motor vehicle employing an interface board according to the invention.
Figure 2:
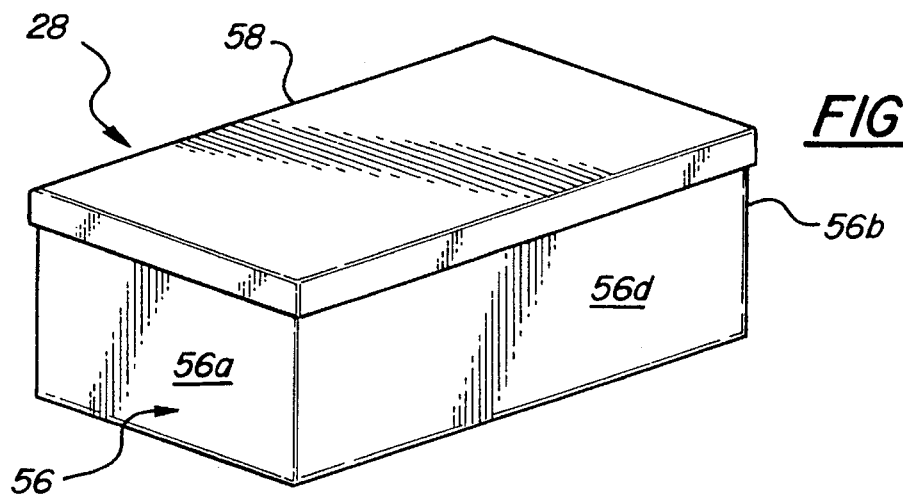
FIG. 2 is a perspective view of an interface board according to the invention.
Figure 3:
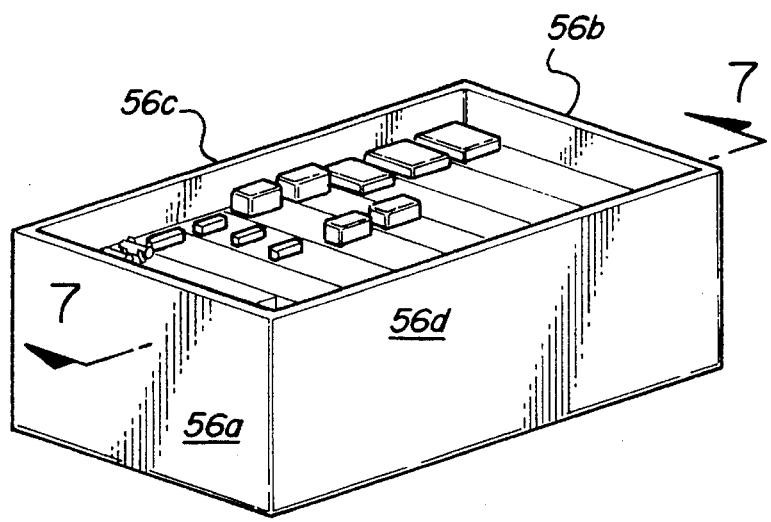
FIG. 3 is a perspective view of the board of FIG. 2 with the cover removed.
Figure 4:
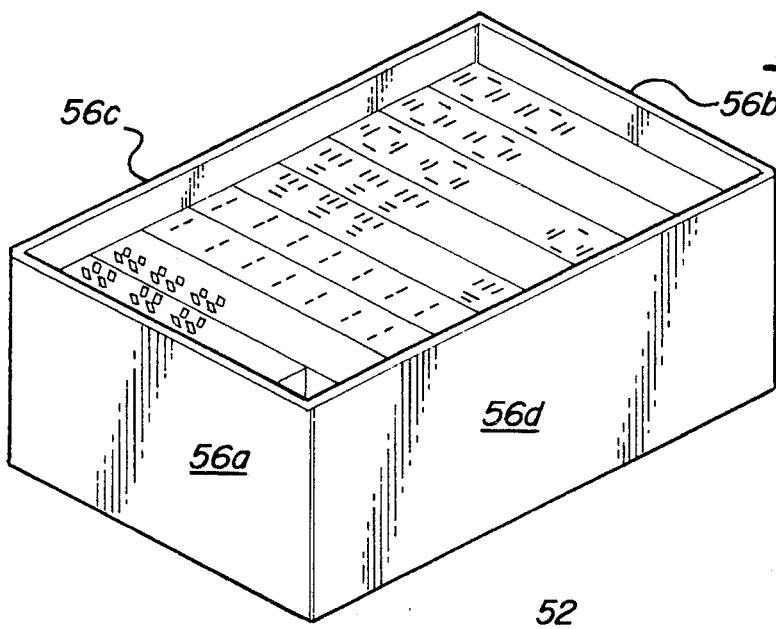
FIG. 4 is a perspective view of the board of FIGS. 2 and 3 with the electrical circuit control elements removed.
Figure 5:
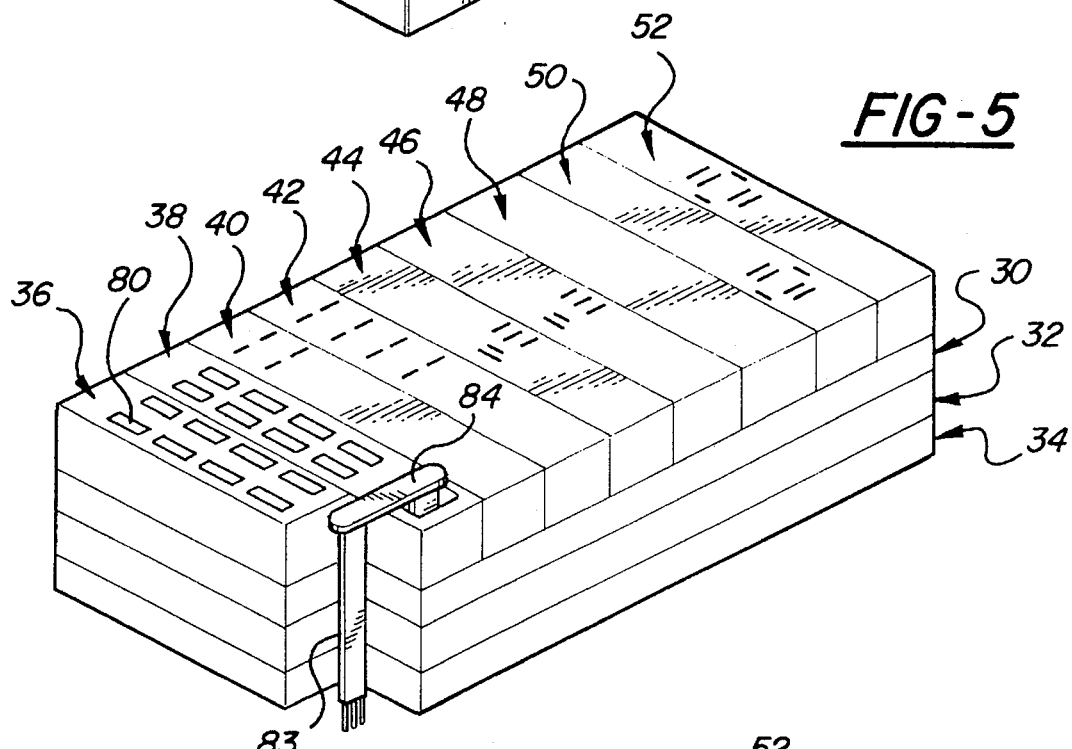
FIG. 5 is a perspective view of the interface board with the box housing removed.
Figure 7:
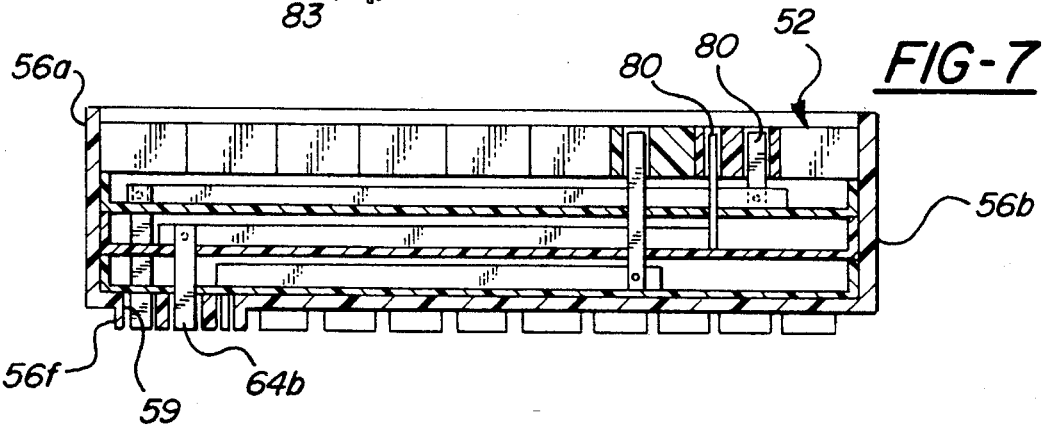
FIG. 7 is a cross-sectional view taken on line 7—7 of FIG. 3.
Figure 8:
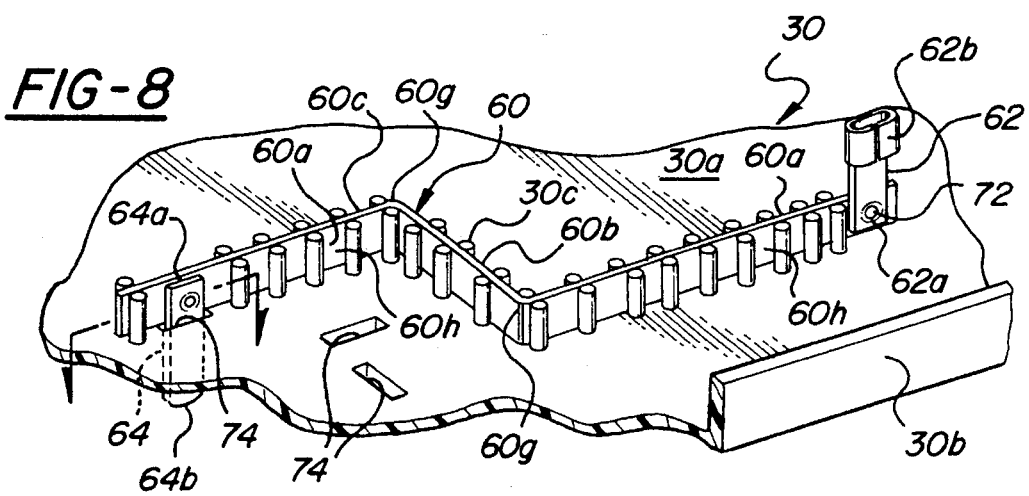
FIG. 8 is a fragmentary perspective view of one of the modular layers.

The invention interface board 10 is seen in FIG. 1 positioned beneath the hood 11 of a motor vehicle 12 where it operates to electrically interconnect one or more wiring harnesses 14, a vehicle battery 16, and a plurality of electrical circuit control elements 18.

Elements 18 may include, for example, mini fuses 20, standard fuses 22, micro relays 24, and ISO relays 26.

Interface board 10 includes a box housing 28; a plurality of board layers 30, 32, and 34; a plurality of block modules 36, 38, 40, 42, 44, 46, 48, 50, and 52; and a plurality of conductor assemblies 54.

Housing 28 has a generally rectangular prismatic configuration and includes a main body box structure 56 and a lid 58, both formed of a suitable plastic material.

Box structure 56 includes end walls 56a and 56b, side walls 56c and 56d, and a bottom wall 56e. Bottom wall 56e includes a plurality of connector pads 56f formed integrally with and extending downwardly from the bottom wall, and a socket opening 59 extends downwardly through the bottom wall and through each pad 56f. Pads 56f are distributed over the entire surface of bottom wall 56e so that socket openings 59 are provided over the entire lower face of the interface board.

Board layers 30, 32, and 34 are formed of a suitable plastic material, have a generally rectangular configuration, and are sized to be stacked snugly within box structure 28 with layer 34 positioned on box structure bottom wall 56e, layer 32 positioned on top of layer 34, and layer 30 positioned on top of layer 32.

Each board layer includes a planar main body portion 30a, 32a, 34a surrounded by an upstanding, circumferential fence or lip 30b, 32b, 34b. The fences or lips 30b, 32b, 34b will be seen to provide the vertical Spacing between the layers with the layers in their stacked configuration within the box structure 28.

Block modules 36–52 each have a rectangular prismatic configuration and are sized to be stacked on top of board layer 30 with the modules extending transversely of the board layer 30 and the modules coacting in side-by-side relation to extend the entire length of the interface board so as to totally cover the top of board layer 30.

Block modules 36–52 are formed of a suitable plastic material and each module defines a unique socket pattern extending through the module with each socket opening in the top face of the module and in the bottom face of the module. For example, modules 36 and 38 may have a socket pattern designed to accommodate mini fuses 20; modules 40 and 42 may have a socket pattern designed to accommodate standard fuses 22; modules 44 and 46 may have a socket pattern designed to accommodate micro relays 24; and modules 48, 50, and 52 may have a socket pattern designed to accommodate ISO relays 26.

Each conductor assembly 54 includes a first or horizontal conductor 60 formed of a suitable conductive material and second or vertical conductors 62, 64 secured to first conductor 60 and also formed of a suitable conductive material. Conductors 60 are formed of a flat ribbon of conductor material and are positioned on the base portion 30a, 32a, 34a of the respective board layers and maintained in a predetermined disposition on the respective base portion by a plurality of upstanding pegs or posts 30c, 32c, 34c integrally upstanding from the base portion of the respective board layer. Each conductor 60 typically has a compound configuration including a plurality of angularly related longitudinal portions 60a, 60b, 60c, 60d, 60e, 60f, etc. interconnected by transverse folds or creases 60g extending parallel to the flat sides 60h of the conductor.

Posts 30c, 32c, 34c are preferably distributed over the entire surface area of the respective base portion and are preferably arranged in groups or patterns of four with spaces between the post in each pattern adequate to loosely pass and position the conductor portions 60a, 60b, 60c, etc. of each conductor 60 and preclude inadvertent displacement of the conductor relative to the respective board layer. Posts 30c, 32c, 34c, and conductors 60 may have a height slightly less than the height of the fences or rims 30b, 32b, 34b so that, with the board layers in a stacked configuration, the tops of the conductors 60 and the tops of the posts are positioned slightly below the underface of the base portion of the overlying board layer.

Each conductor 62 is secured at its lower end 62a to a side face 60h of a respective conductor 60 and extends upwardly therefrom to terminate at its upper end in an integral female terminal 62b.

Each conductor 64 is secured at its upper end 64a to a side face 60h of a respective conductor 60 and extends downwardly therefrom to terminate at its lower end in a male terminal element 64b.

Figure 9:
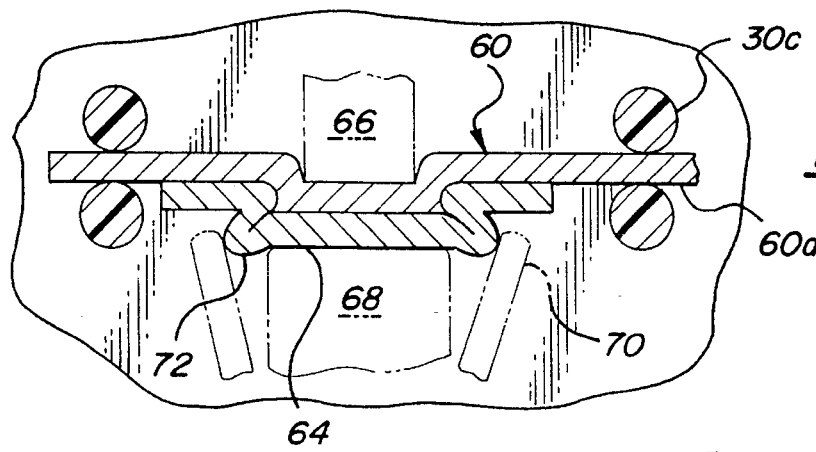
FIG. 9 is a cross-sectional view taken on line 9—9 of FIG. 8.

Conductors 62 and 64 are preferably secured to the side faces 60a of the respective conductor 60 by a clinching operation in which a punch 66 coacts with an anvil 68 and fingers 70 to form a clinch joint 72 to fixedly and rigidly secure the conductors 62 and 64 to the side faces of the conductors 60 and form a positive low resistance electrical path between the respective conductor members. Although punch 66 and anvil 68 appear in dash lines in FIG. 9, it will be understood, as hereinafter more fully described, that the clinch joints 72 are actually formed before the connector assemblies are positioned on the board layers. Punch 66, anvil 68, and fingers 70 may, for example, comprise a clinching tool of the type shown in U.S. Pat. No. 4,803,767.

In the assembled relation of the invention interface board, the board layers 30, 32, and 34 are positioned in stacked relation within the box structure 28; the block modules 36–52 are positioned in overlying relation to the upper layer board 30 and within the box structure 28; conductors 60 are positioned on the base portions of the respective interface boards and held in position by the posts 30c, 32c, 34c; conductors 62 extend upwardly from a respective conductor 60, pass through apertures 74 in the overlying board layers, if any, and extend at their upper ends into a socket 80 in a respective block module 36–52 to position the respective female terminal 62b in the socket 80 for receipt of the male terminal of the respective electrical circuit control element, such as a fuse or relay; conductors 64 extend downwardly from the respective conductor 60 through an aperture 74 in the base portion of the respective board layer, through apertures 74 in the base portions of underlying board layers, if any, and enter at their lower ends into sockets 59 defined within connector pads 56f so as to position the male terminal elements 64b defined at the lower ends of the conductors in a respective socket 59 for coaction with connector elements on the wiring harness 14; and cover 58 is positioned over box structure 56 to provide weather and contaminant protection for the interface board.

It will be understood that, although only a single conductor assembly 54 is shown in association with each board layer 30, in a typical commercial embodiment a plurality of conductor assemblies 54 would be provided on each board layer 30 so as to provide electrical interconnection between the upper and lower faces of the interface board for each of the 70 or more electrical circuits encountered in a typical modern day motor vehicle. Further, although each conductor assembly is shown as comprising a single conductor 60, a single upwardly extending conductor 62, and a single downwardly extending connector 64, other combinations of conductors 60, 62, and 64 are possible for a given conductor assembly including two or more conductors 62 associated with each conductor 60 or two or more conductors 64 associated with each conductor 60. Further, although the conductor 60 has been illustrated and described as having a compound configuration including a plurality of angularly related longitudinal portions, it will be understood that conductor assembly 54 may also, in some applications, comprise a simple, straight conductor 60 with conductors 62 and 64 secured to the straight conductor 60 at longitudinally spaced locations thereon.

In general, the conductor assemblies 54 function to establish electrical interconnection between a particular connection on wiring harness 14 and the male terminal of a particular electrical circuit control element 20, 22, 24, and 26 and operate further to establish return electrical connection between another male terminal male element on the electrical circuit control element and a connector on the wiring harness. However, in some situations positive power will be brought directly to the upper face of the interface board via a cable 83 extending from the positive terminal of the battery 16 and extending upwardly through an opening in the corner of the bottom wall 56e of the box structure and upwardly through aligned cutouts 30d, 32d, 34d in the corners of the board layers 30, 32, and 34 and through a cutout in the upper face of the interface board, defined by foreshortening of the block module 36, for connection to a connector bar 84 extending over and interconnecting module 38 with the cable 82. It will be understood that this arrangement allows positive power to be delivered directly to male terminals of selected circuit control elements 20, 22, 24, and 26, in which case the interface board functions to interconnect another male terminal on the selected circuit control elements with the wiring harness.

Figure 10:
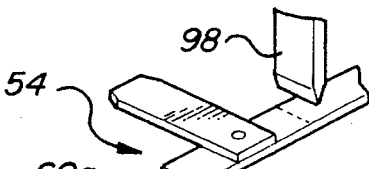
FIG. 10 is a somewhat schematic perspective view illustrating the invention methodology.

The formation of the connector assemblies according to the invention methodology is seen in FIG. 10 wherein a coil 90 of flat conductive ribbon material 60 is provided; the ribbon material 60 is fed past punch 66 which coacts with anvil 68 to secure a conductor 62 to the ribbon with a clinch joint 72; whereafter, at a predetermined longitudinal spacing along the ribbon from the point of attachment of the conductor 62, the punch 66 and anvil 68 again coact to attach a conductor 64 to the ribbon with a further clinch joint 72; whereafter the ribbon 60 with attached conductors 62 and 64 is passed through a four slide machine 92 of known construction wherein a series of slides controlled by computer software 94 function to fold or crease the ribbon 60 at longitudinally spaced locations along the ribbon about transverse crease lines that are parallel to the flat sides of the ribbon; whereafter the ribbon, after emerging from the four slide machine 92, is severed by knives 96 and 98 to form the connector assembly 54 which is thereafter positioned on edge on a respective base portion 30a, 32a, 34a of a respective board layer 30, 32, 34 in the manner previously described.

Figure 10A:
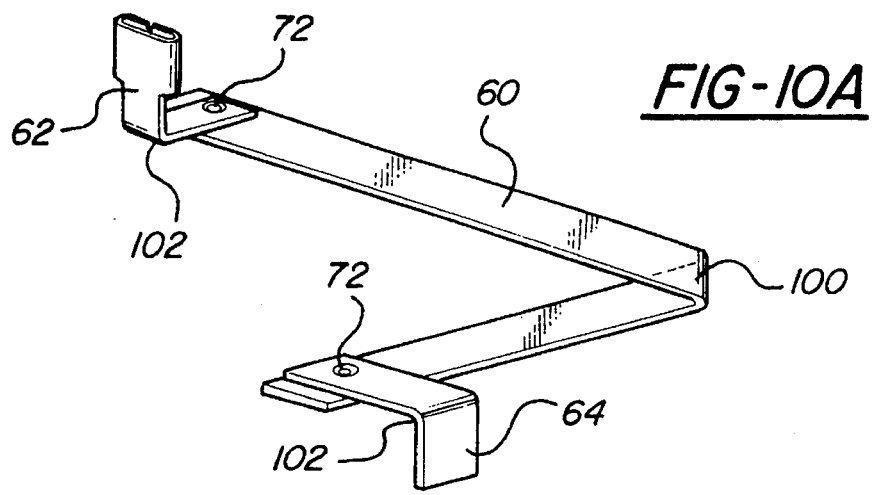
FIG. 10a is a somewhat schematic perspective view illustrating the invention methodology as applied to a second embodiment of the invention.
Figure 11:
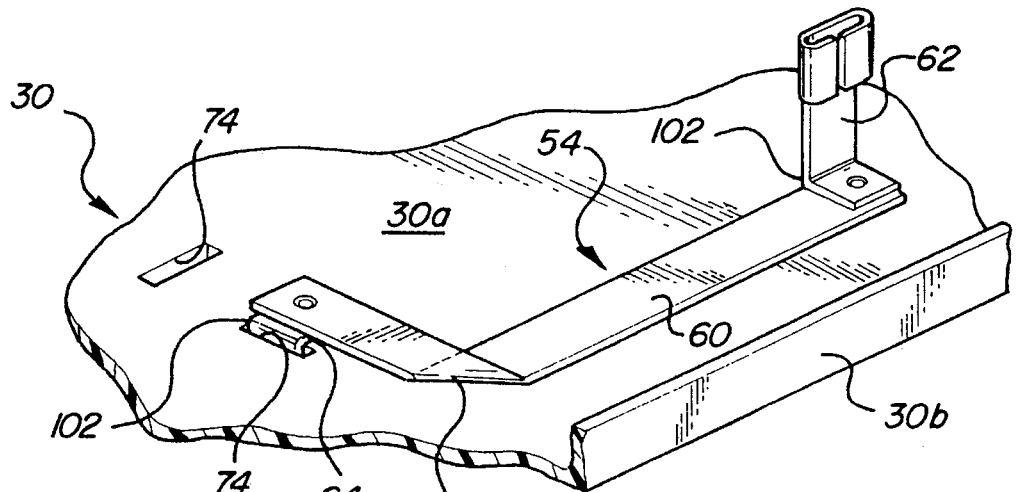
FIG. 11 is a fragmentary perspective view of one of the modular layers utilized in the second embodiment of the invention.

A second embodiment of the invention is illustrated in FIGS. 10a and 11. This embodiment is generally similar to the embodiment of FIGS. 1–10 with the exception that, following the attachment of the secondary conductors 62, 64 to the first conductor 60, the four slide machine 92 is programmed by computer 94 to fold the first conductor along one or more bias lines 100 and to fold conductors 62, 64 along transverse fold lines 102, and the conductor assemblies 54 are positioned on the board layers, as seen in FIG. 11, with the first conductor 60 laying flat against the base portion of the board layer, the second conductor 62 extending vertically upwardly by virtue of fold 102, and the second conductor 62 extending downwardly through an aperture 74 by virtue of the fold 102. Securement means (not shown) will of course be provided to maintain the conductor assembly 54 in its flat position on the board layer.

Figure 12:
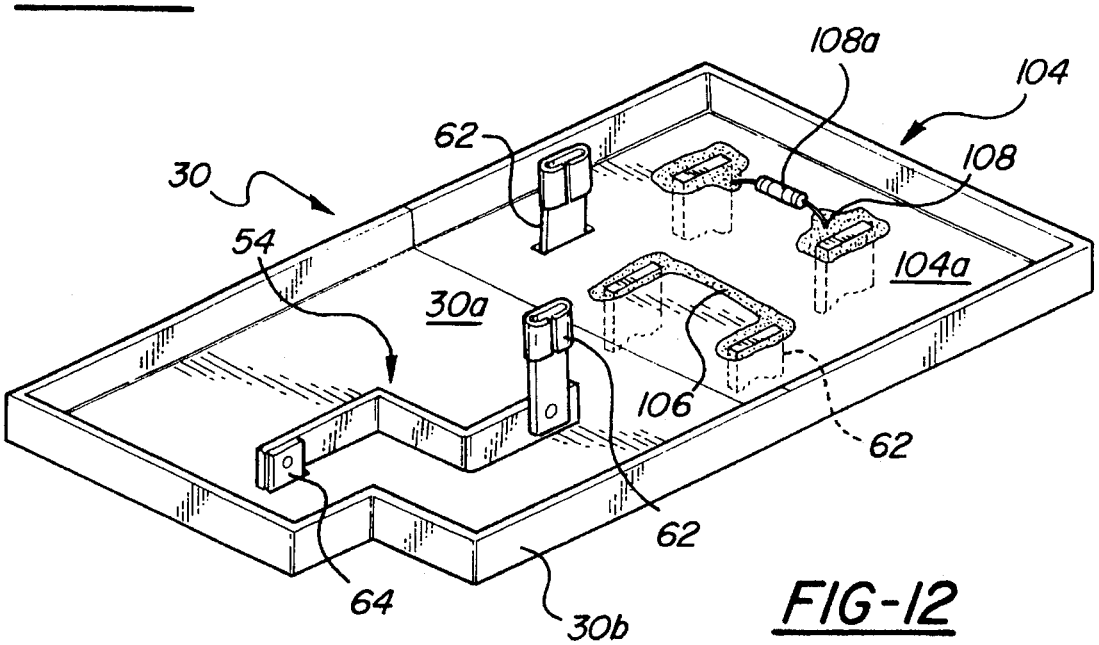
FIG. 12 is a fragmentary perspective view of one of the modular layers utilized in a third embodiment of the invention.

A third embodiment of the invention is illustrated in FIG. 12. In this embodiment one or more of the board layers (for example the board layer 30 illustrated in FIG. 12) is a composite layer comprising a board layer 30 as previously described (including base portion 30a, side wall 30b, and one or more conductor assemblies 54) and a printed circuit board 104 positioned in horizontal alignment with board layer 30 and coacting with the board layer 30 to define the total board layer. Printed circuit board 104 includes, for example, conductive strips 106 and 108 extending between and soldered to the upper ends of secondary conductors 62 which pass upwardly through the base portion 104a of the circuit board for soldering connection to the conductive strips 106, 108. The conductive strip may also include, as seen at 108a, one or more components such as a resistor forming a part of the circuit for connecting the secondary conductors 62. One or more secondary conductors 62 may also pass directly upwardly through the base 104a of the circuit board for direct access to overlying layers or elements.

It will be seen that, with the invention methodology, an unlimited number of configurations of conductor assemblies 54 may be provided depending upon the number of and the longitudinal spacing between the conductors 62 and 64, as determined by the control of the punch 66 and anvil 68 by software 94, and depending upon the number and longitudinal spacing of the crease lines 60a imparted to the ribbon by the four slide apparatus 92 under the control of software 94. Separate hard tooling is therefor not required to provide each separate conductor assembly 54 but, rather, the same apparatus and methodology may be used, with simple modifications of software 94, to provide a wide variety of conductor assemblies to meet a wide variety of vehicle applications as well as to meet a wide variety of different conductor assembly requirements for a given vehicle depending upon optional equipment of the vehicle. Since separate hard tooling is not required to produce each conductor assembly, the cost of the tooling to provide the invention interface board is significantly reduced as compared to prior art interface boards wherein each conductor assembly requires the provision of separate hard tooling for each particular configuration of the conductor assembly.

Further, the clinch joints 72 at the connections between the conductors 62 and 64 and the ribbon conductor 60 provide a simple and inexpensive means of attaching the conductors together and further provides a secure joint with low electrical resistance so as to optimize the electrical efficiency of the interface board.

Further, the block modules 36–52, each providing a unique socket pattern arranged to accommodate the unique male element terminal pattern of a particular electrical circuit control element 20, 22, 24, and 26, enable the electrical capacity or composition of the interface board to be readily modified to provide more or less capacity for a given electrical circuit control element without requiring any major modification of the overall board construction.

Whereas a preferred embodiment of the invention has been illustrated and described in detail, it will be apparent that various changes may be made in the disclosed embodiment without departing from the scope or spirit of the invention.

We claim:

1. An electrical interface board comprising:

a box structure including a plurality of circuit outlets on a first face of the structure for plug in receipt of electrical circuit control elements and a plurality of power outlets on a second, opposite face of the structure for plug in receipt of electrical power input and output element;

a plurality of stacked board layers with each board layer including a planar base portion positioned parallel to the box structure faces;

a series of electrical paths extending between the power outlets and the circuit control outlets and each including first conductors extending generally parallel to the first and second faces and second conductors extending generally perpendicular to the first and second faces, at least certain of the first conductors comprising flat ribbon elements positioned on edge on the planar base portion of one of said board layers with their flat sides perpendicular to the first and second faces and at least certain of the second conductors being secured to the flat sides of the first conductors;

retaining means associated with the planar base portion of each layer for retaining a first conductor on edge and precluding displacement thereof relative to the base portion; and a plurality of apertures formed in the base portion of any overlying or underlying board layers, said second conductors extending through said apertures for access to a first or second face of the box structure.

2. An interface board according to claim 1 wherein the certain second conductors are secured to the certain first conductors by clinch joints.

3. An interface board according to claim 2 wherein:

some of said second conductors terminate proximate said first face in a female terminal and some of said second conductors terminate proximate said second face in male terminals.

4. An electrical interface board according to claim 1 wherein:

at least some of said certain first conductors have a compound configuration including interconnected longitudinal portions joined by transverse crease lines that are parallel to the flat sides of the conductor.

5. An electrical interface board according to claim 1 wherein:

the planar base portion of each board layer includes a plurality of upstanding pegs arranged to receive a first conductor on edge and preclude displacement of the conductor relative to the base portion.

6. An electrical interface board according to claim 1 wherein the interface board further includes a printed circuit board forming at least a portion of at least one of said layers and at least certain of said first conductors comprise conductive strips formed on said printed circuit board.

7. An electrical interface board comprising:

a box structure including a plurality of circuit outlets on a first face of the structure for plug in receipt of electrical circuit control elements, a plurality of power outlets on a second, opposite face of the structure for plug in receipt of electrical power input and output elements, and a series of electrical paths extending between the power outlets and the circuit control outlets and each including first conductors extending generally parallel to the first and second faces and second conductors extending generally perpendicular to the first and second faces, characterized in that:

at least certain of the first conductors comprise flat ribbon elements positioned on edge with their flat sides perpendicular to the first and second faces, and at least certain of the second conductors are secured to the flat sides of the first conductors by clinch joints; and some of said second conductors terminate proximate said first face in a female terminal and some of said second conductors terminate proximate said second face in male terminals.

8. An electrical interface board comprising:

a box structure including a plurality of circuit outlets on a first face of the structure for plug in receipt of electrical circuit control elements, a plurality of power outlets on a second, opposite face of the structure for plug in receipt of electrical power input and output elements, and a series of electrical paths extending between the power outlets and the circuit control outlets and each including first conductors extending generally parallel to the first and second faces and second conductors extending generally perpendicular to the first and second faces, characterized in that: p1 the interface board comprises a plurality of stacked board layers with each board layer including a planar base portion positioned parallel to the box structure faces, the planar base portion of each layer includes a plurality of upstanding pegs arranged to receive a first conductor on edge and preclude displacement of the conductor relative to the base portion;

at least certain of the first conductors comprise flat ribbon elements positioned on edge with their flat sides perpendicular to the first and second faces, and at least certain of the second conductors are secured to the flat sides of the first conductors; and each of said second conductors extend through apertures in the base portion of any overlying or underlying board layers board layers for access to a first or second face of the box structure.

* * * * *